United States Patent
Wang et al.

(10) Patent No.: US 9,064,959 B2
(45) Date of Patent: Jun. 23, 2015

(54) METHOD AND APPARATUS FOR FORMING A CMOS DEVICE

(71) Applicant: Taiwan Semiconductor Manufacturing Company, Ltd., Hsin-Chu (TW)

(72) Inventors: Li-Ting Wang, Tainan (TW); Teng-Chun Tsai, Hsin-Chu (TW); Chun-Hsiung Lin, Zhubei (TW); Cheng-Tung Lin, Jhudong Township (TW); Chi-Yuan Chen, Hsin-Chu (TW); Kuo-Yin Lin, Jhubei (TW); Wan-Chun Pan, Hsin-Chu (TW); Ming-Liang Yen, New Taipei (TW); Huicheng Chang, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/894,902

(22) Filed: May 15, 2013

(65) Prior Publication Data
US 2014/0264362 A1 Sep. 18, 2014

Related U.S. Application Data

(60) Provisional application No. 61/780,786, filed on Mar. 13, 2013.

(51) Int. Cl.
*H01L 29/786* (2006.01)
*H01L 29/78* (2006.01)
*H01L 29/66* (2006.01)

(52) U.S. Cl.
CPC ...... *H01L 29/7831* (2013.01); *H01L 29/66795* (2013.01)

(58) Field of Classification Search
CPC .............. H01L 29/66462; H01L 29/7787; H01L 29/66431; H01L 29/20; H01L 29/78; H01L 29/7786; H01L 29/7831; H01L 29/66795
USPC ......... 257/189, 745, 200, 201, 194, 195, 616, 257/19, 55, 63, 65, 76, 615, 742, 743, 257/E29.296, E29.297
See application file for complete search history.

(56) References Cited

U.S. PATENT DOCUMENTS 4,556,895 A * 12/1985 Ohata ........................... 257/351
2008/0290384 A1* 11/2008 Lolivier et al. ............... 257/295

(Continued)

OTHER PUBLICATIONS

Tanahashi, K. et al., "Thermally Stable Non-gold Ohmic Contacts to n-type GaAs. I. NiGe Contact Metal," Journal of Applied Physics, Nov. 1, 1992, pp. 4183-4190, vol. 72, Issue 9.

(Continued)

*Primary Examiner* — Victor A Mandala
(74) *Attorney, Agent, or Firm* — Slater & Matsil, L.L.P

(57) ABSTRACT

A method and apparatus for forming a CMOS device are provided. The CMOS device may include an N-type channel region formed of an III-V material and a P-type channel region formed of a germanium material. Over each channel may be formed corresponding gates and source/drain regions. The source/drain regions may be formed of a germanium material and one or more metallization layers. An anneal may be performed to form ohmic contacts for the source/drain regions. Openings may be formed in a dielectric layer covering the device and conductive plugs may be formed to provide contact to the source/drain regions.

20 Claims, 5 Drawing Sheets

(56) References Cited

U.S. PATENT DOCUMENTS

| | | | |
|---|---|---|---|
| 2011/0207275 A1* | 8/2011 | Tanaka et al. | 438/268 |
| 2012/0241722 A1* | 9/2012 | Ikeda et al. | 257/19 |
| 2013/0153964 A1* | 6/2013 | Guo et al. | 257/192 |
| 2013/0264609 A1* | 10/2013 | Di et al. | 257/195 |

OTHER PUBLICATIONS

Kawata, H. et al., "NiGe-based Ohmic Contacts to *n*-type GaAs. II. Effects of Au Addition," Journal of Applied Physics, Mar. 1, 1994, pp. 2530-2537, vol. 75, Issue 5.

Marshall, E.D. et al., "Nonalloyed Ohmic Contacts to *n*-GaAs by Solid-phase Epitaxy of Ge," Journal of Applied Physics, Aug. 1, 1987, pp. 942-947, vol. 62, Issue 3.

Baca, A.G. et al., "A survey of Ohmic Contacts to III-V Compound Semiconductors," Thin Solid Films, Oct. 1997, pp. 599-608, vol. 308-309.

Anderson, Jr. W. et al., "Development of Ohmic Contacts for GaAs Devices Using Epitaxial Ge Films," IEEE Journal of Solid-State Circuits, Aug. 1978, pp. 430-435, vol. SC-13, No. 4.

Claeys, C. et al., "Contact Technology Schemes for Advanced Ge and III-V CMOS Technologies," 2012 $8^{th}$ International Caribbean Conference on Devices, Circuits and Systems (ICCDCS), Mar. 14-17, 2012, pp. 1-6.

\* cited by examiner

METHOD AND APPARATUS FOR FORMING A CMOS DEVICE

CROSS-REFERENCE TO RELATED APPLICATIONS

This application claims the benefit of priority to U.S. Provisional Application Ser. No. 61/780,786, filed on Mar. 13, 2013, entitled "Method and Apparatus for Forming a CMOS Device," which application is hereby incorporated by reference herein.

BACKGROUND

Compound semiconductor materials of group III and group V elements (referred to as III-V compound semiconductors hereinafter) are good candidates for forming transistors due to their high electron mobility. III-V compound semiconductor films, however, are typically grown on other substrates because it is difficult to obtain bulk III-V compound semiconductor crystals. The growth of III-V compound semiconductor films on dissimilar substrates faces difficulties because these substrates can have lattice constants and thermal expansion coefficients different from that of the III-V compound semiconductors.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments. Throughout the various views and illustrative embodiments, like reference numbers are used to designate like elements.

Embodiments discussed herein may provide a CMOS device having formed therein III-V and germanium FinFET-type or planar type structures. The structures may be formed on a silicon substrate thereby reducing manufacturing costs as compared to other FinFET or planar type structures that are formed on substrates that include materials such as GaAs or Ge. Substrates that include GaAs or Ge typically utilize toxic, rare earth materials such Pd or expensive materials such as Au in order to form N-type or P-type devices on the substrates. Such GaAs or Ge based devices utilize complex manufacturing processes, which further increase the cost of such devices. Embodiments discussed herein may provide a CMOS device having formed therein III-V and germanium FinFET-type or planar structures using silicon based substrates.

FIGS. 1A-1G illustrate cross-sectional views of intermediate stages for forming an integrated III-V/Ge CMOS device 100 in accordance with an embodiment. FIG. 2 illustrates a method 200 of the processes illustrated in FIGS. 1A-1G in accordance with an embodiment.

Figure 1A:
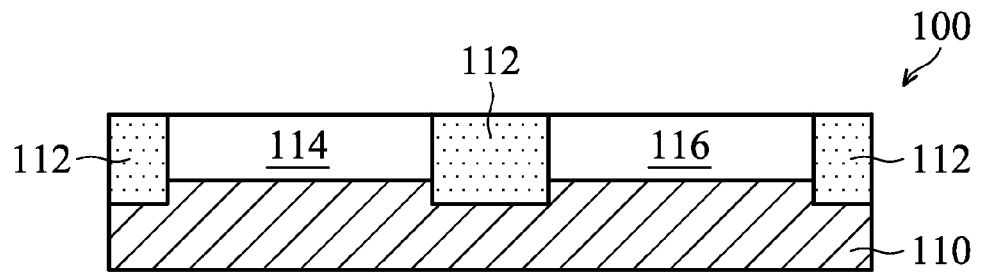
FIGS. 1A-1G illustrate cross-sectional views of intermediate stages for forming an integrated III-V/Ge CMOS device in accordance with an embodiment.
Figure 2:
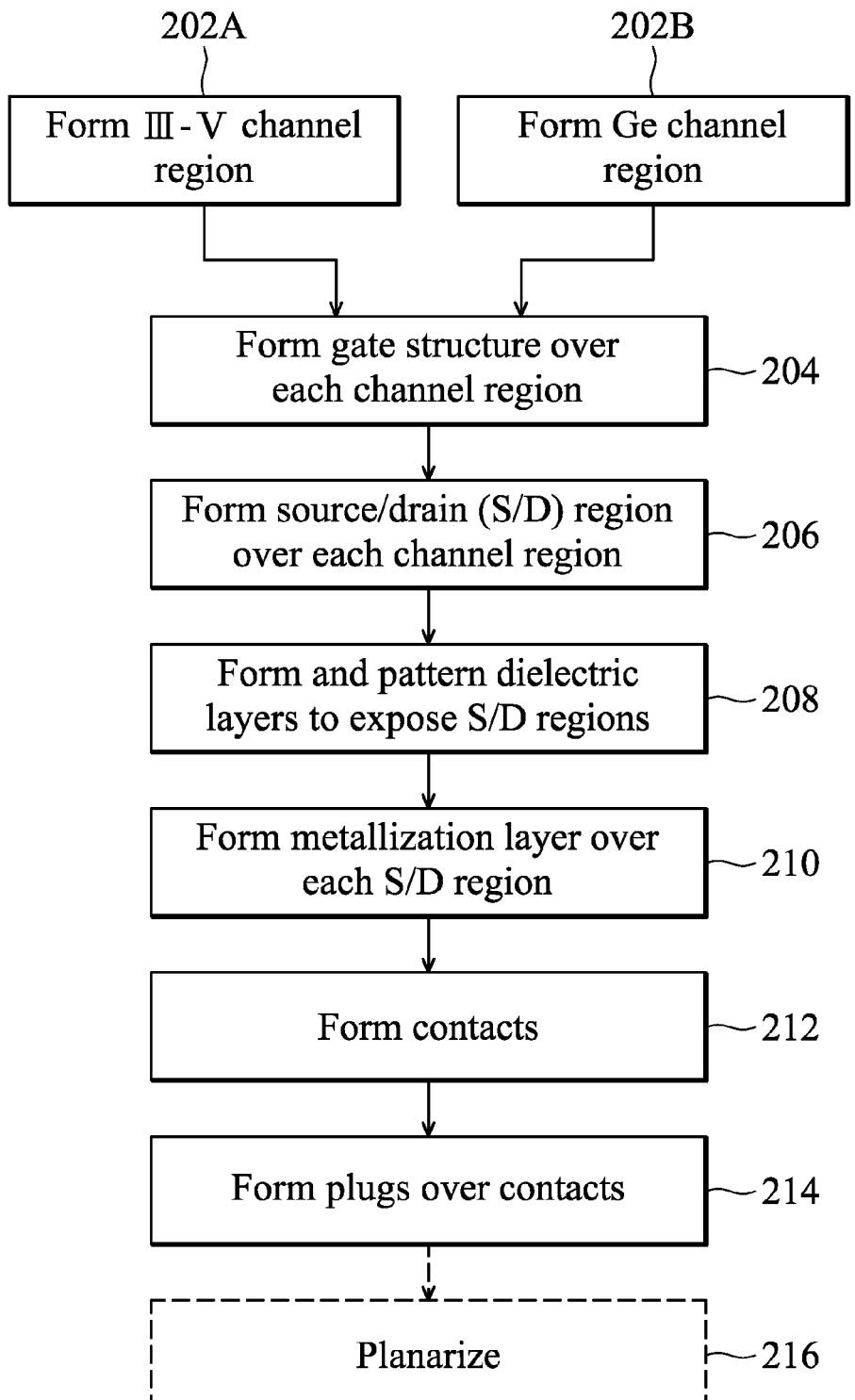
FIG. 2 illustrates a method of the process illustrate in FIGS. 1A-1G in accordance with an embodiment.

As illustrated in FIG. 1A, the device 100 may include a substrate 110, a plurality of isolation regions 112. An N-type channel region 114 and a P-type channel region 116 may be formed over the substrate 110 (blocks 202A, 202B). The N-type channel 114 and the P-type channel 116 may be separated by the isolation regions 112. The location of the N-type channel 114 and the P-type channel 116 is provided for illustrative purposes only and is not meant to limit the scope of the embodiments described herein. For example, channel region 114 could be a P-type channel and channel region 116 could be an N-type channel.

The substrate 110 may comprise a semiconductor material such as silicon, diamond, or the like. Alternatively, the substrate 110 may comprise compound silicon-based materials. The N-type channel 114 may be formed of an III-V epitaxial layer and the P-type channel 116 may be formed of a Ge epitaxial layer. In an embodiment, the isolation regions 112 may be formed of an oxide material such as a high-density plasma (HDP) oxide, or the like, using any suitable method. Optionally, an oxide liner (not shown) may be formed along the sidewalls of the isolation regions 112.

Figure 1B:
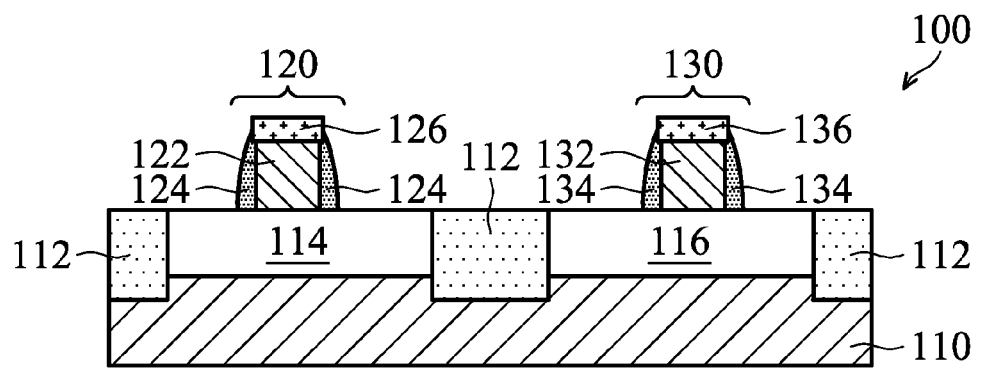

As illustrated in FIG. 1B, a first gate structure 120 may be formed over the N-type channel region 114 and a second gate structure 130 may be formed over the P-type channel region 116 (block 204). The first gate structure 120 may include a first gate electrode 122 formed over the N-type channel 114 and one or more first sidewall spacers 124 formed adjacent to the first gate electrode 122. In an embodiment, a first hard mask layer 126 may be formed over the first gate electrode 122. The second gate structure 130 may include a second gate electrode 132 formed over the P-type channel 116 and one or more second sidewall spacers 134 formed adjacent to the second gate electrode 132. In an embodiment, a second hard mask layer 136 may be formed over the second gate electrode 132.

Figure 1C:
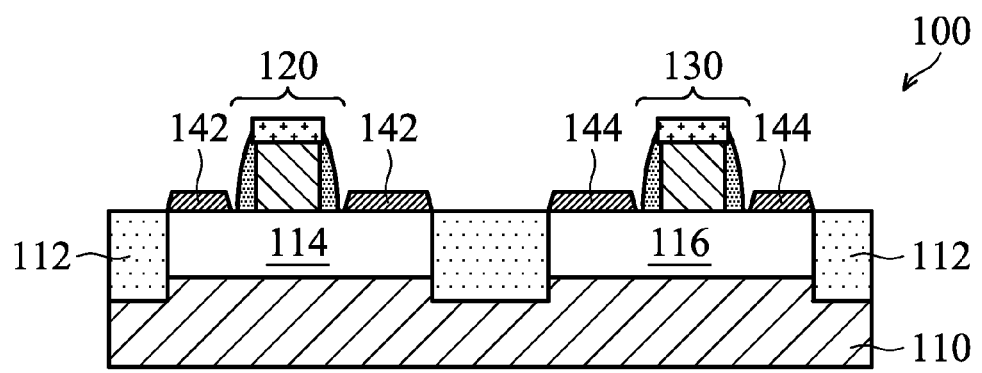
Figure 1D:
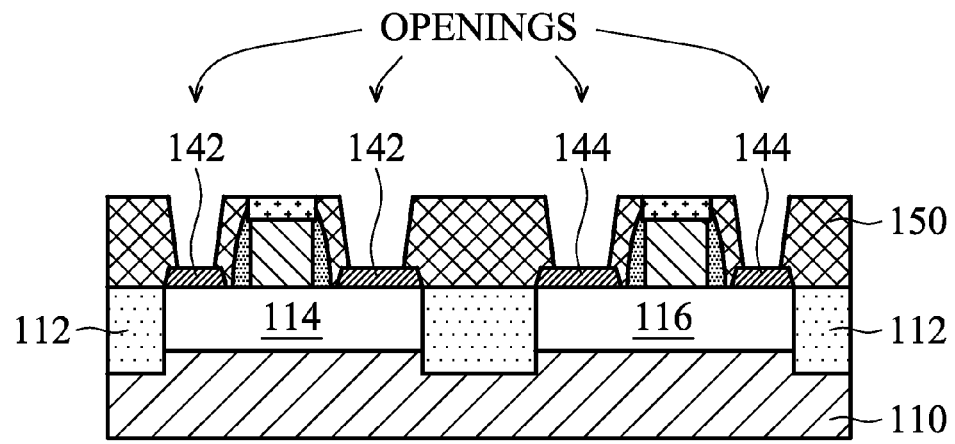

As illustrated in FIG. 1C a first raised source and drain region 142 may be formed over the N-type channel 114 and a second raised source and drain region 144 may be formed over the P-type channel 116 (block 206). The first raised source and drain regions 142 may comprise a germanium material, such as, for example an epitaxial germanium layer. The second raised source and drain regions 144 may comprise a germanium material, such as, for example an epitaxial germanium layer. In an embodiment, the first and second raised source and drain regions may be doped using an impurity such as, for example boron or arsenic. The doping may be performed by ion implantation, plasma doping, monolayer doping, combinations thereof and the like.

A dielectric layer 150 may be formed over the first raised source and drain regions 142 and the second raised source and drain regions 144. The dielectric layer 150 may be patterned and etched to expose the first and second source and drain regions 142, 144 (block 208). The forming and patterning may be performed using one or more subtractive etch processes. In an embodiment, the dielectric layer 150 may include one or more dielectric layers or insulating layers, such as, for example one or more dielectric materials such as oxide, nitride, silicon oxide, silicon nitride, low-k dielectrics such as carbon doped oxides, extremely low-k dielectrics such as porous carbon doped silicon dioxide, a polymer such as polyimide, or a combination thereof.

Figure 1E:
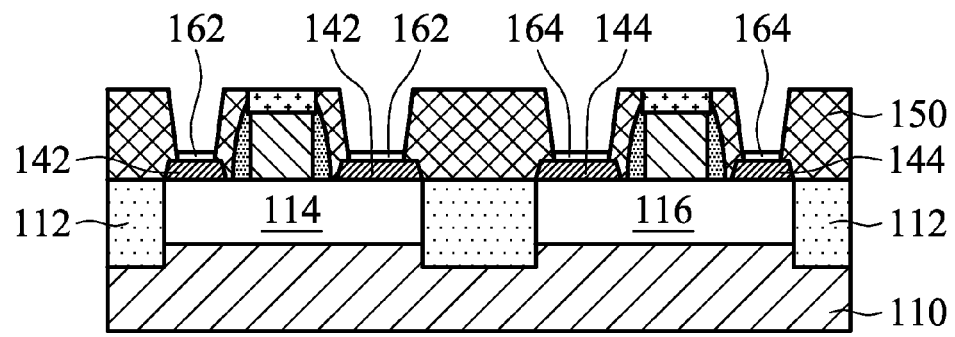

As illustrated in FIG. 1E, a first metallization layer 162 may be formed over each of the first raised source and drain regions 142; a second metallization layer 164 may be formed over each of the second raised source and drain regions 144 (block 210). The first and second metallization layers 162, 164 may be made of a same or different material. In various embodiments, the first and second metallization layers 162 may be made of copper, aluminum, gold, silver, tin, titanium, tungsten, nickel, combinations thereof or the like. The first and second metallization layers 162, 164 may be formed using a process such as, for example, thermal chemical vapor deposition ("CVD"), physical vapor deposition ("PVD"), plasma enhanced chemical vapor deposition ("PECVD"), electrochemical plating, electroless plating, one or more subtractive etch processes, single damascene techniques, and/or dual-damascene techniques, the like or other acceptable methods.

Figure 1F:
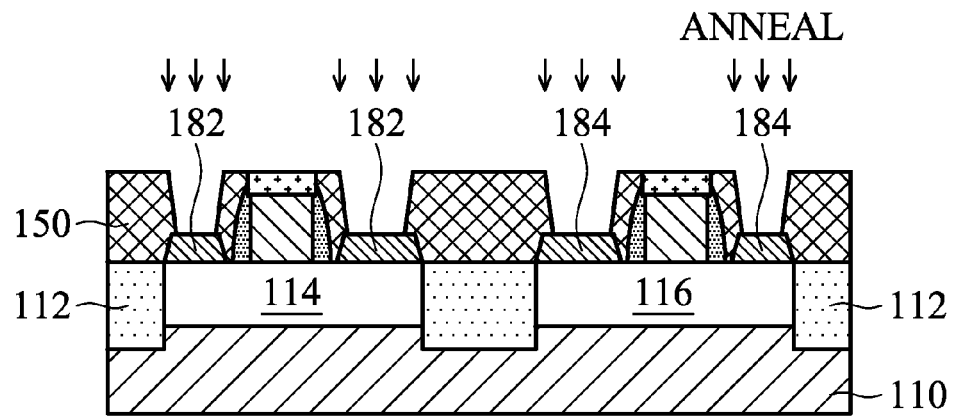

As illustrated in FIG. 1F, the first and second source and drain regions 142, 144 and corresponding first and second metallization layers 162, 164 may be annealed to form a corresponding first pair of ohmic contacts 182 and a corresponding second pair of ohmic contacts 184 (block 212). In various embodiments, the anneal may include a spike anneal, a millisecond anneal ("MSA"), combinations thereof or the like. The anneal may be performed at temperatures ranging from approximately 250° C. to approximately 1250° C. Excess metallization layers (not shown) on areas of the dielectric layer 150 surrounding the first and second pair of ohmic contacts 182 may be removed using one or more selective etch processes following the anneal.

Figure 1G:
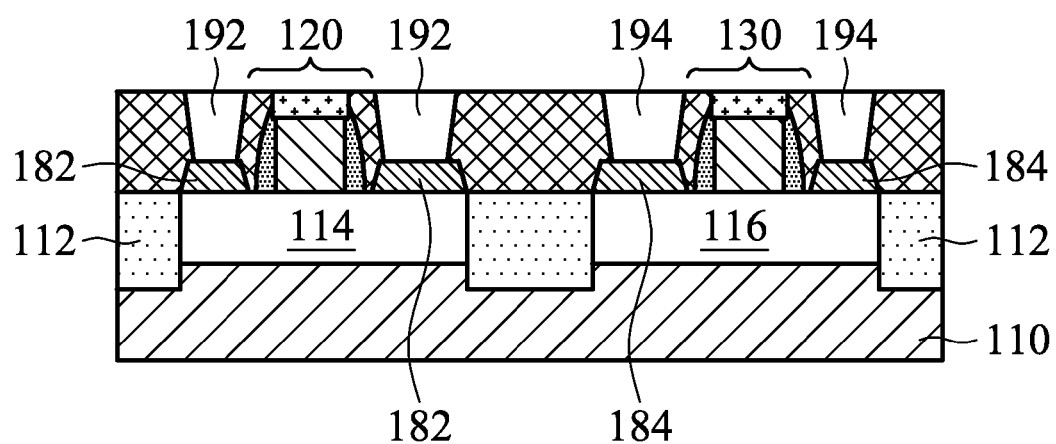

As shown in FIG. 1G, a first pair of conductive pillars 192, also referred to as conductive plugs, may be formed overlying the first pair of ohmic contacts 182 and a second pair of conductive pillars 194, also referred to as conductive plugs, may be formed overlying the second pair of ohmic contacts 184. The first and second pair of conductive plugs may be formed of copper, aluminum, tungsten, gold, silver, tin, titanium, tungsten, nickel, combinations thereof or the like (block 214). The first and second pairs of conductive plugs 192, 194 may be formed using a process such as, for example, CVD, PVD, PECVD, electrochemical plating, electroless plating, one or more subtractive etch processes, single damascene techniques, and/or dual-damascene techniques, the like or other acceptable methods.

The first and second pairs of conductive plugs 192, 194 may be formed to extend through the dielectric layer 150 to a top surface of the dielectric layer 150. In an embodiment, the first and second pairs of conductive plugs 192, 194 and the dielectric layer 150 may be planarized (block 216) to form a uniform surface over the device 100.

Figure 3:
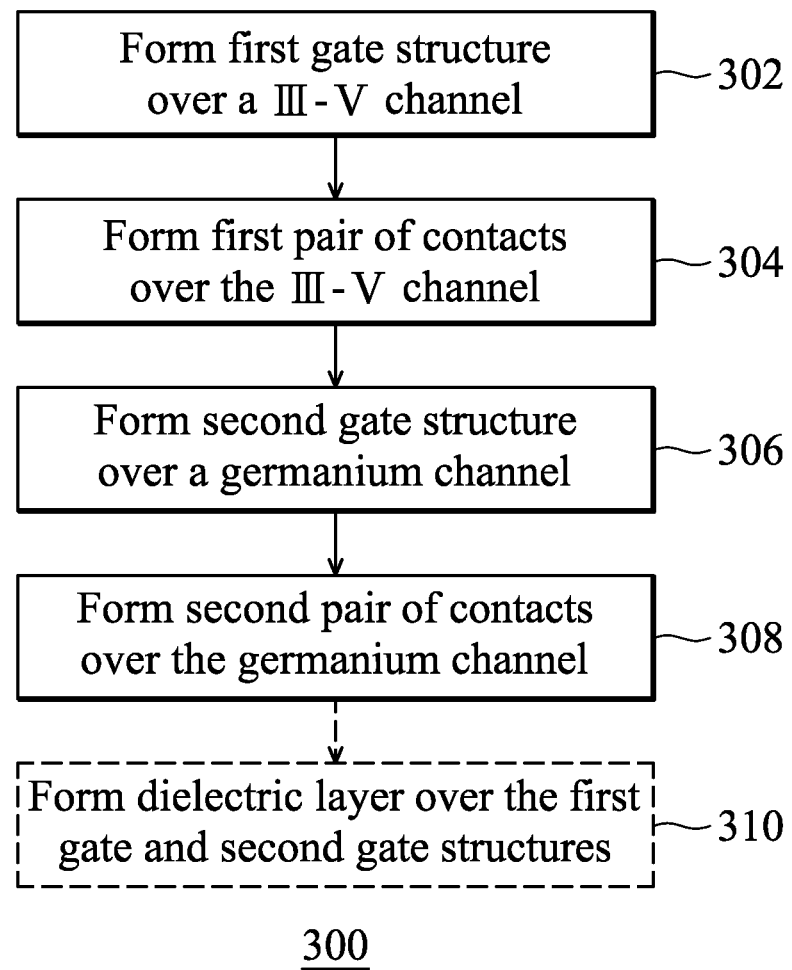
FIG. 3 illustrates another method of forming a device according to an embodiment.

FIG. 3 illustrates a method 300 of forming a device in according with an embodiment. The method 300 may form a first gate structure over an III-V channel in a silicon substrate (bock 302). The method 300 may form a first pair of contacts over the III-V channel (block 304). Each of the first pair of contacts may comprise a germanium material. The method 300 may form a second gate structure over a germanium channel in the substrate (block 306). The method 300 may form a second pair of contacts over the germanium channel (block 308). Each of the second pair of contacts may comprise a germanium material. The III-V channel and the germanium channel may be separated by an isolation region.

In an embodiment, the method may form a dielectric layer over the first and the second gate (block 310). The first and second pair of contacts may extend through the dielectric layer to a top surface of the dielectric layer. In an embodiment, the first pair of contacts may include a first pair of germanium layers over the III-V channel and first pair of conductive layers over the first pair of germanium layers. The method 300 may anneal the first pair of germanium layers and the first pair of conductive layers. The method may form a first pair of conductive plugs over the first pair of germanium layers and the first pair of conductive layers after performing the annealing. The method 300 may form a dielectric layer over the first gate structure and the second gate structure, wherein the first pair of conductive plugs extend through the dielectric layer to a top surface of the dielectric layer.

In an embodiment, the second pair of contacts may include a second pair of germanium layers over the germanium channel and a second pair of conductive layers over the second pair of germanium layers. The method 300 may anneal the second pair of germanium layers and the second pair of conductive layers. The method 300 may form a second pair of conductive plugs over the second pair of germanium layers and the second pair of conductive layers after performing the annealing. The method 300 may form a dielectric layer over the first gate structure and the second gate structure, wherein the second pair of conductive plugs extend through the dielectric layer to a top surface of the dielectric layer.

In an embodiment, a device is provided. The device may include a III-V channel region formed over a silicon substrate; a germanium channel region formed over the substrate, the III-V channel region and the germanium channel region separated by an isolation region; a first gate structure formed over the III-V channel region; a first pair of contacts over the III-V channel region, the first pair of contacts comprising a germanium material; a second gate structure formed over the germanium channel region; a second pair of contacts formed over the germanium channel region, the second pair of contacts comprising a germanium material; and a dielectric layer overlying first and the second gate, wherein the first pair of contacts and the second pair of contacts extend through corresponding openings in the dielectric layer to a top surface of the dielectric layer.

In an embodiment, the first gate structure may include a gate electrode formed over the III-V channel region; a sidewall spacer adjacent to the gate electrode; and a mask layer overlying the gate electrode. In an embodiment, the second gate structure may include a gate electrode formed over the germanium channel; a sidewall spacer adjacent to the gate electrode; and a mask layer overlying the gate electrode.

In an embodiment, each of the first pair of contacts and the second pair of contacts may include an epitaxial germanium layer; and a conductive layer overlying the germanium layer. The conductive layer may be made of copper, aluminum, gold, silver, tin, titanium, tungsten, nickel, or combinations thereof. Each of the first pair of contacts and the second pair of contacts may further include a conductive plug coupled to the conductive layer. The conductive plug may be made of copper, aluminum, eutectic solder, tin, tungsten, nickel, gold, silver, titanium or combinations thereof.

In an embodiment, each of the first pair of contacts and the second pair of contacts may include an ohmic contact and a conductive plug coupled to the ohmic contact. The ohmic contact may be made of a germanium material.

In an embodiment, another device is provided. The device may include a first semiconductor structure that may include a first gate electrode formed over a III-V channel region and first source/drain regions formed adjacent to the first gate electrode, wherein the first source/drain regions comprise a first pair of ohmic contacts and a first pair of conductive plugs formed over the first pair of ohmic contacts. The device may include a second semiconductor structure that may include a second gate electrode formed over a germanium channel region, wherein the germanium channel region comprises a germanium epitaxial layer and second source/drain regions formed adjacent to the second gate electrode, wherein the second source/drain regions comprise a second pair of ohmic contacts and a second pair of conductive pillars formed over the first pair of ohmic contacts. The device may further include a dielectric layer formed over the first and second semiconductor structures, wherein the first pair of conductive plugs and the second pair of conductive plugs are exposed from the dielectric layer.

In another embodiment, a method is provided. The method may include forming a first gate structure over a III-V channel; forming a first pair of contacts over the III-V channel, wherein each of the first pair of contacts comprises a germanium material; forming a second gate structure over a germanium channel; and forming a second pair of contacts over the germanium channel, wherein each of the second pair of contacts comprises a germanium material.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
    a III-V channel region formed over a silicon substrate;
    a germanium channel region formed over the silicon substrate, the III-V channel region and the germanium channel region separated by an isolation region;
    a first gate structure formed over the III-V channel region;
    a first pair of contacts over the III-V channel region, the first pair of contacts comprising a germanium material;
    a second gate structure formed over the germanium channel region;
    a second pair of contacts formed over the germanium channel region, the second pair of contacts comprising a germanium material; and
    a dielectric layer overlying first and the second gate, wherein the first pair of contacts and the second pair of contacts extend through corresponding openings in the dielectric layer to a top surface of the dielectric layer.

2. The device of claim 1, wherein the III-V channel region further comprises a III-V epitaxial layer.

3. The device of claim 1, wherein the germanium channel region further comprises a germanium epitaxial layer.

4. The device of claim 1, wherein each of the first pair of contacts and the second pair of contacts further comprises:
    a germanium epitaxial layer; and
    a conductive layer overlying the germanium layer.

5. The device of claim 4, wherein the conductive layer is made of copper, aluminum, gold, silver, tin, titanium, tungsten, nickel, or combinations thereof.

6. The device of claim 4, wherein each of the first pair of contacts and the second pair of contacts further comprises a conductive plug overlying to the conductive layer.

7. The device of claim 6, wherein the conductive plug is made of copper, aluminum, eutectic solder, tin, tungsten, nickel, gold, silver, titanium or combinations thereof.

8. The device of claim 1, wherein each of the first pair of contacts and the second pair of contacts further comprises:
    an ohmic contact; and
    a conductive plug overlying the ohmic contact.

9. A device comprising:
    a first semiconductor structure, comprising:
        a first gate electrode formed over a III-V channel region;
        first source/drain regions formed adjacent to the first gate electrode, wherein the first source/drain regions comprise a first pair of ohmic contacts and a first pair of conductive plugs formed over the first pair of ohmic contacts, wherein the first pair of ohmic contacts comprises germanium;
    a second semiconductor structure, comprising:
        a second gate electrode formed over a germanium channel region, wherein the germanium channel region comprises a germanium epitaxial layer;
        second source/drain regions formed adjacent to the second gate electrode, wherein the second source/drain regions comprise a second pair of ohmic contacts and a second pair of conductive plugs formed over the first pair of ohmic contacts; and
    a dielectric layer formed over the first and second semiconductor structures, wherein the first pair of conductive plugs and the second pair of conductive plugs are exposed from the dielectric layer.

10. The device of claim 9, wherein the first and second pair of ohmic contacts further comprises:
    an epitaxial germanium layer; and
    a conductive layer overlying the epitaxial germanium layer.

11. The device of claim 9, further comprising:
    a first pair of sidewall spacers adjacent to the first gate electrode; and
    a first mask layer overlying the first gate electrode.

12. The device of claim 9, further comprising:
    a first pair of sidewall spacers adjacent to the second gate electrode; and
    a second mask layer overlying the second gate electrode.

13. A semiconductor device comprising:
    a semiconductor substrate;
    a III-V channel region over a first portion of the semiconductor substrate;
    a first contact over the III-V channel region, the first contact comprising germanium;
    a germanium channel region over a second portion of the semiconductor substrate; and
    a second contact over the germanium channel region, the second contact comprising germanium.

14. The semiconductor device of claim 13, wherein the first contact further comprises a metal.

15. The semiconductor device of claim 13, wherein the III-V channel region further comprises a III-V epitaxial layer.

16. The semiconductor device of claim 13, further comprising a gate structure overlying the III-V channel region.

17. The semiconductor device of claim 16, further comprising a dielectric layer overlying the gate structure.

18. The semiconductor device of claim 17, further comprising a conductive plug extending through the dielectric layer and in physical contact with the first contact.

19. The semiconductor device of claim 18, wherein the conductive plug comprises copper.

20. The semiconductor device of claim 13, wherein the first contact comprises copper.

\* \* \* \* \*